United States Patent
Thees et al.

(10) Patent No.: US 9,214,463 B2
(45) Date of Patent: Dec. 15, 2015

(54) METHODS OF FORMING METAL SILICIDE REGIONS ON A SEMICONDUCTOR DEVICE

(71) Applicant: GLOBALFOUNDRIES Inc., Grand Cayman (KY)

(72) Inventors: Hans-Juergen Thees, Dresden (DE); Peter Baars, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/326,623

(22) Filed: Jul. 9, 2014

(65) Prior Publication Data
US 2014/0319617 A1     Oct. 30, 2014

Related U.S. Application Data

(62) Division of application No. 13/180,655, filed on Jul. 12, 2011, now Pat. No. 8,859,356.

(51) Int. Cl.
| | |
|---|---|
| H01L 21/00 | (2006.01) |
| H01L 27/092 | (2006.01) |
| H01L 29/78 | (2006.01) |
| H01L 21/768 | (2006.01) |
| H01L 21/8238 | (2006.01) |
| H01L 29/423 | (2006.01) |
| H01L 29/49 | (2006.01) |

(52) U.S. Cl.
CPC ........ *H01L 27/092* (2013.01); *H01L 21/76889* (2013.01); *H01L 21/823814* (2013.01); *H01L 21/823835* (2013.01); *H01L 21/823864* (2013.01); *H01L 29/4232* (2013.01); *H01L 29/4975* (2013.01); *H01L 29/78* (2013.01)

(58) Field of Classification Search
CPC ................ H01L 21/76889; H01L 21/823814; H01L 21/823835; H01L 21/823864; H01L 29/78; H01L 29/4232; H01L 29/4975; H01L 27/092
USPC .................................................. 438/199, 696
See application file for complete search history.

(56) References Cited

U.S. PATENT DOCUMENTS

| | | | |
|---|---|---|---|
| 5,654,242 A | 8/1997 | Komatsu | |
| 7,226,859 B2 | 6/2007 | Wieczorek et al. | |
| 7,510,926 B2* | 3/2009 | Wei et al. | 438/221 |
| 7,517,766 B2* | 4/2009 | Chou et al. | 438/303 |
| 7,563,700 B2* | 7/2009 | Srivastava et al. | 438/592 |
| 7,579,228 B2* | 8/2009 | Grudowski et al. | 438/199 |
| 7,811,877 B2 | 10/2010 | Ramamurthy et al. | |
| 7,858,524 B2 | 12/2010 | Aoyama | |
| 8,143,131 B2* | 3/2012 | Hsu et al. | 438/303 |
| 2008/0237726 A1* | 10/2008 | Dyer | 257/369 |
| 2011/0031538 A1* | 2/2011 | Hsieh et al. | 257/288 |

* cited by examiner

*Primary Examiner* — Nicholas Tobergte
(74) *Attorney, Agent, or Firm* — Amerson Law Firm, PLLC

(57) ABSTRACT

An integrated circuit device includes a PMOS transistor and an NMOS transistor. The PMO transistor includes a gate electrode, at least one source/drain region, a first sidewall spacer positioned adjacent the gate electrode of the PMOS transistor, and a multi-part second sidewall spacer positioned adjacent the first sidewall spacer of the PMOS transistor, wherein the multi-part second sidewall spacer includes an upper spacer and a lower spacer. The NMOS transistor includes a gate electrode, at least one source/drain region, a first sidewall spacer positioned adjacent the gate electrode of the NMOS transistor, and a single second sidewall spacer positioned adjacent the first sidewall spacer of the NMOS transistor. A metal silicide region is positioned on each of the gate electrodes and on each of the at least one source/drain regions of the PMOS and the NMOS transistors.

20 Claims, 4 Drawing Sheets

METHODS OF FORMING METAL SILICIDE REGIONS ON A SEMICONDUCTOR DEVICE

CROSS-REFERENCE TO RELATED APPLICATION

This is a divisional of co-pending application Ser. No. 13/180,655, filed Jul. 12, 2011.

BACKGROUND OF THE INVENTION

1. Field of the Invention

Generally, the present disclosure relates to integrated circuits, and, more particularly, to various methods of forming metal silicide regions on an integrated circuit device, and to devices incorporating such metal silicide regions.

2. Description of the Related Art

The fabrication of complex integrated circuits requires the provision of a large number of transistor elements, which represent the dominant circuit elements in complex integrated circuits. For example, several hundred millions of transistors may be provided in presently available complex integrated circuits, wherein performance of the transistors in the speed critical signal paths substantially determines overall performance of the integrated circuit. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface positioned between highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

FIG. 1A schematically illustrates a cross-sectional view of an illustrative integrated circuit device 100 in an advanced manufacturing stage. As shown, the device 100 comprises a substrate 10, such as a semiconductor material and the like, that is divided into a plurality of active regions, which are to be understood as semiconductor regions, in and above which one or more transistors are to be formed. For example, one or more isolation regions 12, such as a shallow trench isolation, define and separate the substrate 10 into an illustrative PMOS region 10P, in and above which an illustrative PMOS transistor 100P will be formed, and an illustrative NMOS region 10N, in and above which an illustrative NMOS transistor 100N will be formed. Depending on the overall device requirements, the substrate 10 may be in bulk form (as depicted) or in the form of a silicon-on-insulator (SOI) construction comprised a of a bulk semiconductor layer, a buried insulating material and an active layer. At the point of fabrication depicted in FIG. 1A, each of the transistors includes an illustrative gate insulation layer 20, a illustrative gate electrode structure 24, source/drain regions 26, and sidewall spacers 28 (on the PMOS device 100P) and 30 (on the NMOS device 100N). Each of these components may be formed using a variety of known materials and techniques. The gate insulation layer 20 and the gate electrode structure 24 are intended to be schematic and representative in nature in that they may be comprised on a variety of different materials and the may not be the same for each of the PMOS device 100P and the NMOS device 100N. For example, the NMOS device 100N may have gate insulation layer 20 made of silicon dioxide and a gate electrode 24 made of polysilicon, while the PMOS device 100P may have a gate insulation layer 20 that includes a high-k dielectric material (k value greater than 10). The illustrative source/drain regions 26 are formed by performing the appropriate ion implantation process such that, after performing a heat treatment process, the source/drain regions 26 have the appropriate lateral and vertical dopant profile so as to comply with the requirements of the devices 100P, 100N. The illustrative spacers 28, 30 may be initially formed by depositing a layer of spacer material, e.g., an insulator such as silicon nitride, silicon dioxide, etc., and thereafter performing an anisotropic etching process. The spacers 28 and/or 30 may be formed directly on the sidewalls of the gate electrode 24, or there may be liner or other spacer positioned between the spacers 28, 30 and its associated gate electrode 24.

After the spacers 28, 30 are initially formed, the PMOS device 100P and the NMOS device 100N are typically subjected to differing process operations in part because of the different materials of construction and structure of the two different devices. For example, in one illustrative example, the PMOS device 100P may include an epitaxial layer of silicon germanium that is formed in the substrate 10 at least under the gate insulation layer 20. Additionally, in some cases, the PMOS device 100P has one or more layer of silicon germanium formed in the substrate 10 in the area where the source/drain region 26 will be formed for the PMOS device 100P. These structures are typically formed to enhance the performance of the PMOS device 100P, and they are typically not formed on the NMOS device 100N. Among other things, such difference mean that the PMOS device 100P may be subject to different and perhaps more processing operations than the NMOS device 100N, such as additional etching processes. As a result of such different processing, the height of the spacers 28 on the PMOS device 100P is less than the height of the spacers 30 on the NMOS device 100N. Stated another way, there is more spacer "pull-back" on the PMOS transistor 100P than on the NMOS transistor 100N.

The next step in the manufacture of the devices 100P, 100N involves the formation of metal silicide regions, e.g., nickel-platinum metal silicide regions, on the source/drain regions 26 and on the gate electrodes 24. Such metal silicide regions may be formed using a variety of materials and using a variety of know techniques. As shown in FIG. 1B, a layer of a refractory metal 32, e.g., nickel, platinum, cobalt, etc., or combinations thereof, is blanket-deposited on the device 100.

Thereafter, as shown in FIG. 1C, one or more heating processes are performed to convert the portions of the layer of refractory metal 32 that are in contact with a silicon-containing material, like the gate electrode 24 and the source/drain regions 26, to metal silicide regions 34 (on the source/drain regions 26) and metal silicide regions 36P, 36N on the PMOS device 100P and the NMOS device 100N, respectively.

There are several potential problems with the aforementioned processing scheme. First, in modern semiconductor devices, the space between the gate electrode for the PMOS device 100P and the gate electrode 24 for the NMOS device 100N is very small, e.g., on the order of approximately 60-90 nm. As a result, the thickness of the layer of refractory metal 32 that is actually deposited on the substrate 10 between the gate electrode structures 24 is relatively thin, e.g., 5-15 nm, as compared to the thickness of the layer of refractory metal 32 that is deposited above the gate electrodes 24 which may be about 10-25 nm in thickness, because the step coverage during the deposition of the layer of refractory metal 32 is aspect ratio dependent. As a result, the thickness of the metal silicide regions 34 on the source/drain regions 26 may tend to be much thinner than the metal silicide regions 36P, 36N. Additionally, the lateral position of the metal silicide regions 36 relative to the channel regions of the devices 100P, 100N tends to be defined by the base thickness of the spacers 28, 30, which may not be the same for both of the devices 100P, 100N. In some cases, the metal silicide regions 36 may be made of a metal silicide, e.g., nickel silicide, that tends to grow aggressively under the edge of the spacers 28, 30 toward the channel region of the respective devices. If the metal silicide regions 34 creep to far toward the channel region, the resulting device may exhibit greater leakage currents that anticipated or desired, which may adversely impact the performance of the resulting transistor devices. Both of the metal silicide regions 36P, 36N typically tend to exhibit a mushroom-type configuration because of the spacer "pull-back" on both of the devices 100P, 100N. However, due to the greater spacer "pull-back" on the PMOS device 100P, the metal silicide region 36P on the PMOS device 100P tends to be larger than the metal silicide region 36N on the NMOS device 100N. This size difference occurs because of the exposure of the additional surface area of the gate electrode 24 for the PMOS device 100P. Such size differences can be problematic in modern semiconductor devices which very small spacing between adjacent gate electrode structures 24. Moreover, depending upon the size of the metal silicide regions 36P, 36N, and there position, i.e., they may not be positioned directly over the gate electrodes 24 as depicted, it may be difficult to form a contact to the source/drain region 26 without shorting-out to at least one of the metal silicide regions 36P, 36N.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming metal silicide regions on an integrated circuit device, and to devices incorporating such metal silicide regions. In one illustrative example, the present disclosure is directed to an integrated circuit device that includes a PMOS transistor that includes a gate electrode, at least one source/drain region, a first sidewall spacer positioned adjacent the gate electrode of the PMOS transistor, and a multi-part second sidewall spacer positioned adjacent the first sidewall spacer of the PMOS transistor, wherein the multi-part second sidewall spacer includes an upper spacer and a lower spacer, an NMOS transistor that includes a gate electrode, at least one source/drain region, a first sidewall spacer positioned adjacent the gate electrode of the NMOS transistor, and a single second sidewall spacer positioned adjacent the first sidewall spacer of the NMOS transistor and a metal silicide region on each of the gate electrodes and on each of the at least one source/drain regions.

In another exemplary embodiment disclosed herein, an integrated circuit device includes first and second transistors positioned in and above respective first and second active regions of a semiconducting substrate. Each of the first and second transistors include a gate electrode, source and drain regions, and a first sidewall spacer positioned adjacent the gate electrode. Additionally, a multi-part second sidewall spacer is positioned adjacent the first sidewall spacer of said first transistor, and the multi-part second sidewall spacer includes an upper spacer and a lower spacer that is vertically separated from the upper spacer. The disclosed integrated circuit device further includes, among other things, a single continuous third sidewall spacer positioned adjacent the first sidewall spacer of the second transistor, and a metal silicide region on each of the gate electrodes and on each of the source and drain regions of the first and second transistors.

In yet a further illustrative embodiment, an integrated circuit device is disclosed that includes, among other things, first and second transistors positioned in and above respective first and second active regions of a semiconducting substrate. The first and second transistors include respective first and second gate electrodes, respective first and second source/drain regions, and respective first and second sidewall spacers positioned adjacent the respective first and second gate electrodes. Furthermore, the disclosed device also includes a metal silicide region on each of the first and second gate electrodes and on each of the first and second source/drain regions. Additionally, a multi-part second sidewall spacer that includes an upper spacer and a lower spacer is positioned adjacent the first sidewall spacer, wherein a base of the lower spacer is positioned on the first active region between the metal silicide region on the first source/drain regions and the first sidewall spacer. Moreover, a top of the lower spacer is vertically separated from a bottom of the upper spacer by a separation distance. Finally, the illustrative integrated circuit device includes a single continuous third sidewall spacer positioned adjacent the second sidewall spacer, wherein a base of the single continuous third spacer is positioned on the second active region between the metal silicide region on the second source/drain regions and the second sidewall spacer.

BRIEF DESCRIPTION OF THE DRAWINGS

The disclosure may be understood by reference to the following description taken in conjunction with the accompanying drawings, in which like reference numerals identify like elements, and in which.

Figure 1A:
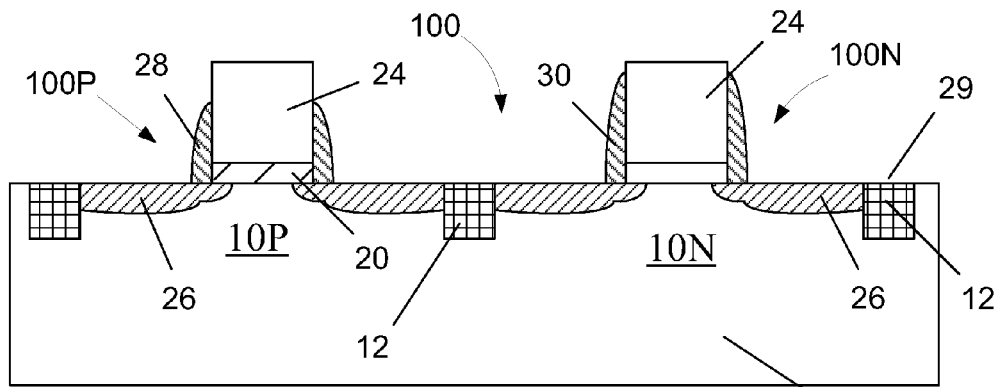
FIGS. 1A-1C schematically illustrate cross-sectional views of an illustrative semiconductor device that includes a PMOS transistor and an NMOS transistor, both of which have metal silicide regions formed thereon in accordance with one illustrative prior art technique.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
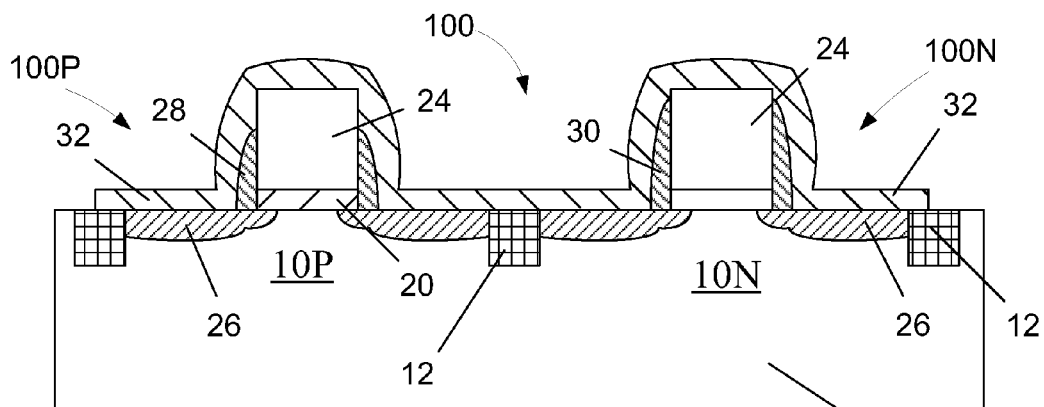
Figure 1C:
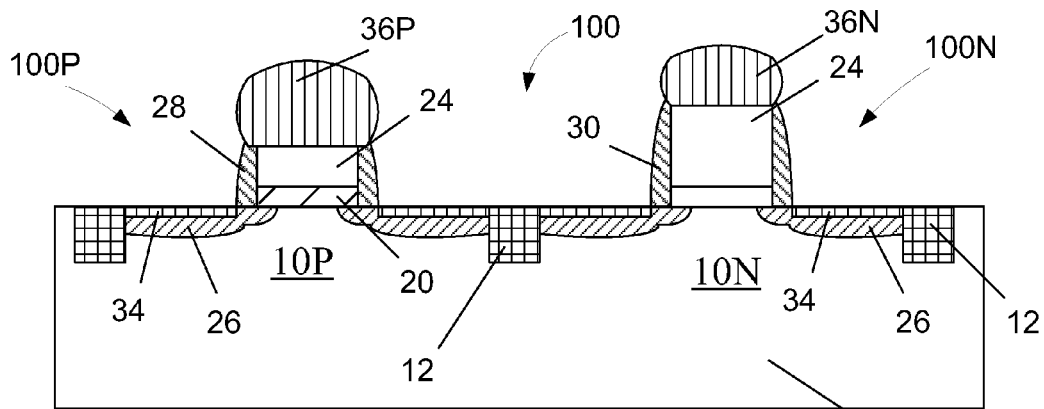

The present disclosure is directed to various methods of forming metal silicide regions on a semiconductor device, and to various devices incorporating such metal silicide regions. In some cases, the transistors disclosed herein may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIG. 2A-2G, further illustrative embodiments will now be described in more detail, wherein reference may also be made to FIGS. 1A-1C, if required, wherein the use of the same reference number in the drawings will refer to the same structure as previously described.

Figure 2A:
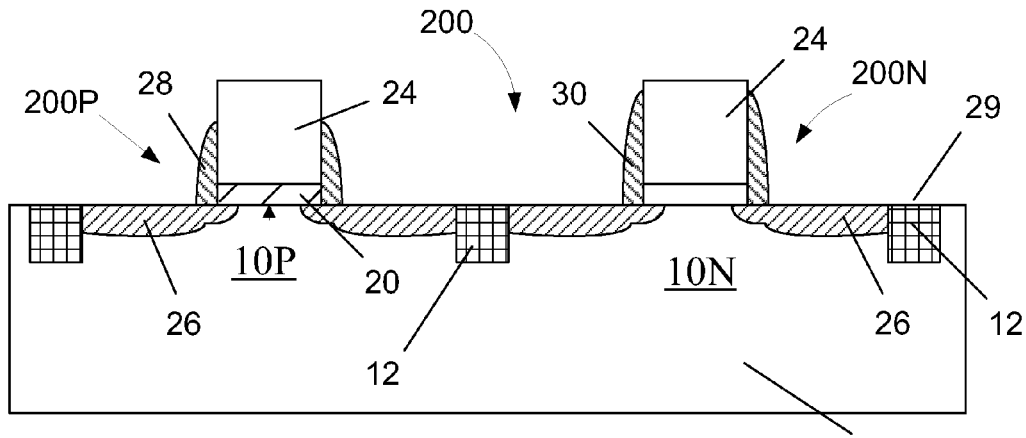
FIGS. 2A-2G depict one illustrative method disclosed herein for forming metal silicide regions on an integrated circuit device.

FIG. 2A schematically illustrates a cross-sectional view of an illustrative integrated circuit device 200 in an advanced manufacturing stage. As shown, the device 200 includes an illustrative PMOS transistor 200P formed in and above a PMOS region 10P, and an illustrative NMOS transistor 200N formed in and above a NMOS region 10N. The point of fabrication depicted in FIG. 2A is similar to that depicted in FIG. 1A. Accordingly, each of the transistors 200P, 200N includes an illustrative gate insulation layer 20, a illustrative gate electrode structure 24, source/drain regions 26, and first sidewall spacers 28 (on the PMOS device 100P) and 30 (on the NMOS device 100N). As noted earlier, each of these components may be formed using a variety of known materials and techniques. Additionally, the gate insulation layer 20 and the gate electrode structure 24 are intended to be schematic and representative in nature in that they may be comprised of a variety of different materials and the may not be the same for each of the PMOS device 100P and the NMOS device 100N. The illustrative spacers 28, 30 may be initially formed by depositing a layer of spacer material, e.g., an insulator such as silicon nitride, silicon dioxide, etc., and thereafter performing an anisotropic etching process. In one illustrative example, the spacers 28, 30 may have a thickness at their base of approximately 4-15 nm, and they may not be the same thickness at the point of fabrication depicted in FIG. 2A. The spacers 28 and/or 30 may be formed directly on the sidewalls of the gate electrode 24, or there may be liner or other spacer positioned between the spacers 28, 30 and its associated gate electrode 24. Thus, when it is stated herein that the spacers are formed "adjacent" the gate electrodes 24, such language will be understood to include situation where the sidewall spacer is formed directly on and in contact with the gate electrode and situation where there is an intervening structure between the spacer and the gate electrode 24. At the point of fabrication depicted in FIG. 2A, there is more spacer "pull-back" on the PMOS transistor 200P than on the NMOS transistor 200N, i.e., more surface area of the gate electrode 24 is exposed on the PMOS device 200P as compared to the NMOS device 200N, for the reasons explained in the background section of this application.

Figure 2B:
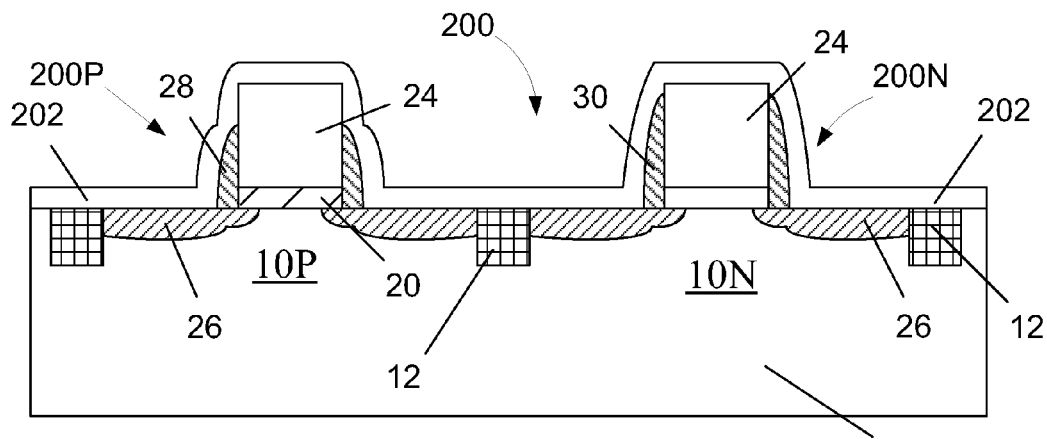

As shown in FIG. 2B, the next step involves blanket-depositing a layer of spacer material 202 across the device 200. The layer of spacer material 202 may be comprised of the same material as that of the spacers 28 and/or 30, or it may be made of a different material. In one illustrative example, the layer of spacer material 202 may be comprised of silicon nitride, it may have a thickness ranging from approximately 8-15 nm and it may be formed by performing a deposition process, such as a chemical vapor deposition process.

Figure 2C:
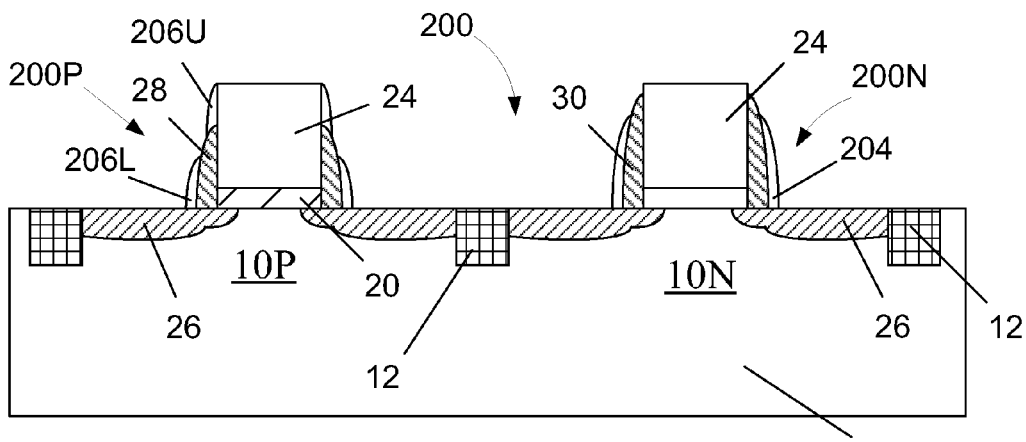

FIG. 2C depicts the device 200 at a point in fabrication after an anisotropic etching process has been formed on the layer of spacer material 202. This etching process results in the formation of an additional second spacer 204 adjacent the first spacer 30 on the NMOS device 200N, and the formation of a multiple-part second spacer—lower spacer 206L and an upper spacer 206U adjacent the first spacer 28 on the PMOS device 200P. As noted earlier, when it is stated herein that the spacers 204, 206U, 206L are formed "adjacent" another structure or component, like the gate electrodes 24 or the sidewall spacers 28, 30, such language will be understood to include situation where the subject spacer is formed directly on and in contact with the referenced structure or component and the situation where there is an intervening structure between the subject spacer and the referenced structure or component. In general, at this point in the process, the upper spacer 206U tends to cover at least some of the exposed portion of the gate electrode 24 of the PMOS device 200P, while the lower spacer 206L and the spacer 204 will be employed to eventually insure that metal silicide regions that are to be formed on the source/drain regions 26 will be located a sufficient distance from the channel region of the devices 200P and/or 200N. It should also be noted that, in one illustrative embodiment, the spacers 206L and 206U are formed at different levels or heights in the device 200—they are positioned in different and separated horizontal planes. For example, in one illustrative embodiment, the top of the lower spacer 206L may be separated by a vertical distance of approximately 5-20 nm from the bottom or base of the upper spacer 206U. In one illustrative embodiment, the spacer 204 may have a thickness at its base of approximately 5-10 nm and an overall length or height of approximately 70-90% of the height of the gate electrode 24; the spacer 206L may have a thickness at its base of approximately 5-10 nm and an overall length or height of approximately 20-50% of the height of the gate electrode 24; and the spacer 206U may have a thickness at its base of approximately 3-8 nm and an overall length or height of approximately 5-30% of the height of the gate electrode.

Figure 2D:
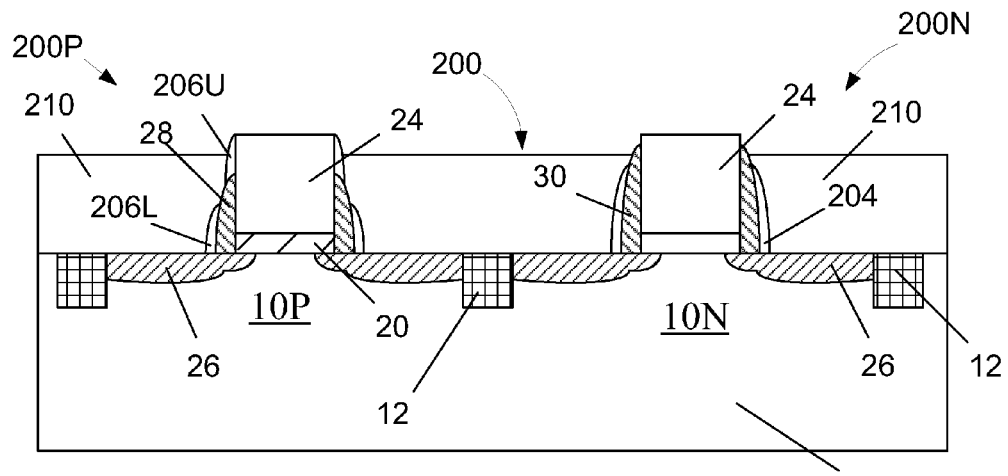
Figure 2E:
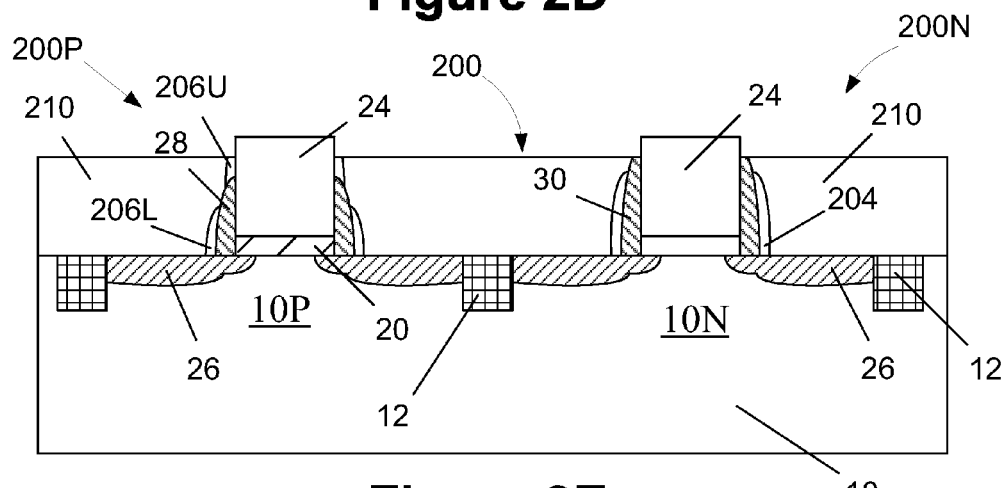

As shown in FIG. 2D, the next step involves the formation of an etch-stop/fill layer 210 across the device 200. The layer 210 may be comprised of an appropriate organic material or a resist material, and it may be formed by a variety of known techniques, a spin-on technique, etc. Initially, in one illustrative embodiment, the layer 210 may be formed to a thickness that an upper surface of the layer 210 extends above the height of the gate electrodes 24. Thereafter, as depicted in FIG. 2E, a controlled etching process is performed to reduce the thickness of the layer 210 such that the upper surfaces of the gate electrodes 24 and at least portions of the spacers 206U (on the PMOS device 200P) and the spacers 30 (on the NMOS device 200N) are exposed, as shown in FIG. 2E. In one illustrative embodiment, this process insures that exposed portions of the gate electrodes 24 is approximately the same for both the PMOS device 200P and the NMOS device 200N. As a result of controlling the aforementioned etch process, the amount and degree of the relatively uniform exposure of the gate electrode structures 24 can be controlled. Accordingly, the metal silicide regions that will ultimately be formed on the gate electrode structures 24 will be more uniform in size and configuration. In an alternative embodiment, the layer 210 may simply be deposited to the desired final thickness of the layer without having to perform the etching process referenced above after the initial deposition of the layer 210.

Figure 2F:
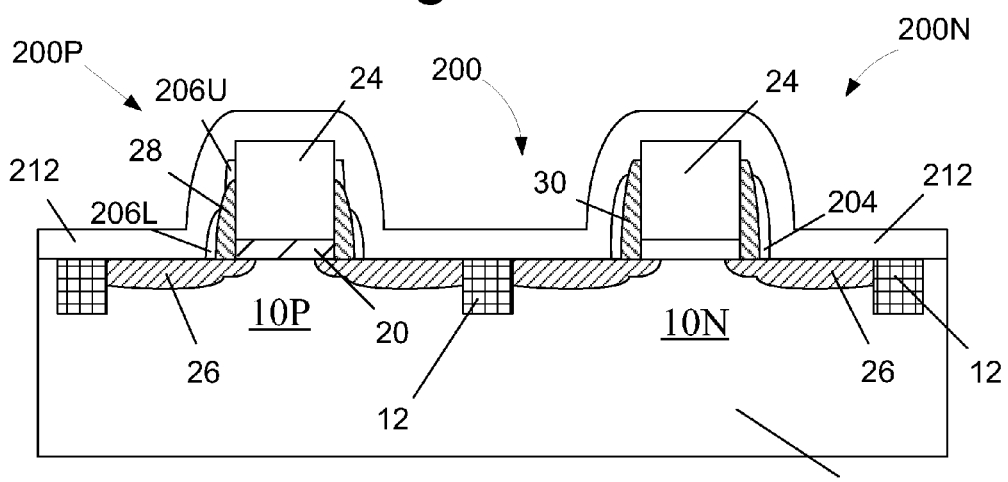
Figure 2G:
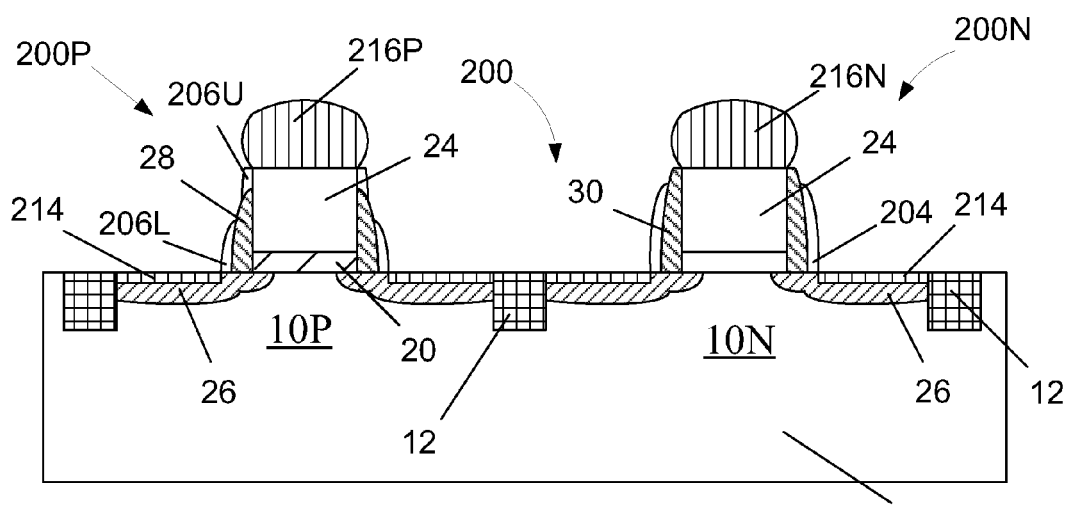

Next, as shown in FIG. 2F, a layer of refractory metal 212, e.g., nickel, platinum, cobalt, etc., or combinations thereof, such as a nickel-platinum layer, may be blanket deposited on the device 200 by performing, for example, a physical vapor deposition (PVD) process. The layer of refractory metal may be deposited to any desired thickness. Next, as shown in FIG. 2G, one or more known heating processes and stripping processes are performed to form the metal silicide region 214 on the source/drain regions 26 and to form the metal silicide regions 216P, 216N on the gate electrode structures 24 of the PMOS device 200P and the NMOS device 200N, respectively. The temperature and duration of such heating processes and stripping may vary depending upon a variety of factors such as the type of refractory metal involved, the desired resulting thickness of the metal silicide regions, etc., all of which are known to those skilled in the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit device, comprising:
   a PMOS transistor comprising a gate electrode, at least one source/drain region, a first sidewall spacer positioned adjacent said gate electrode of said PMOS transistor, and a multi-part second sidewall spacer positioned adjacent said first sidewall spacer of said PMOS transistor, said multi-part second sidewall spacer comprising an upper spacer and a lower spacer;
   an NMOS transistor comprising a gate electrode, at least one source/drain region, a first sidewall spacer positioned adjacent said gate electrode of said NMOS transistor, and a single second sidewall spacer positioned adjacent said first sidewall spacer of said NMOS transistor; and
   a metal silicide region on each of said gate electrodes and on each of said at least one source/drain regions of said PMOS and said NMOS transistors, wherein a base of said lower spacer of said PMOS transistor is positioned on a semiconducting substrate between said metal silicide region on said at least one source/drain region of said PMOS transistor and said first sidewall spacer of said PMOS transistor.

2. The device of claim 1, wherein a portion of said upper spacer of said PMOS transistor is on a sidewall of said gate electrode of said PMOS transistor.

3. The device of claim 2, wherein at least a portion of said upper spacer on said PMOS transistor contacts said first spacer on said PMOS transistor.

4. The device of claim 1, wherein a base of said single second spacer on said NMOS transistor is positioned on said semiconducting substrate between said metal silicide region on said at least one source drain region of said NMOS transistor and said first sidewall spacer on said NMOS transistor.

5. The device of claim 1, wherein said upper spacer is located at a different height level than said lower spacer.

6. The device of claim 1, wherein a top of said lower spacer is separated from a bottom of said upper spacer by a vertical distance of at least 5-20 nm.

7. The device of claim 1, wherein said upper spacer and said lower spacer are positioned in different and separated horizontal planes.

8. The device of claim 6, wherein said lower spacer has an overall height that is equal to approximately 20-50% of a height of said gate electrode of said PMOS transistor and the upper spacer has an overall height that is equal to approximately 5-30% of the height of said gate electrode of said PMOS transistor.

9. An integrated circuit device, comprising:
   first and second transistors positioned in and above respective first and second active regions of a semiconducting substrate, each of said first and second transistors comprising a gate electrode, source and drain regions, and a first sidewall spacer positioned adjacent said gate electrode;
   a multi-part second sidewall spacer positioned adjacent said first sidewall spacer of said first transistor, said multi-part second sidewall spacer comprising an upper spacer and a lower spacer that is vertically separated from said upper spacer;

a single continuous third sidewall spacer positioned adjacent said first sidewall spacer of said second transistor; and a metal silicide region on each of said gate electrodes and on each of said source and drain regions of said first and second transistors.

10. The device of claim 9, wherein a base of said lower spacer on said first transistor is positioned on said first active region between said metal silicide region on each of said source and drain regions of said first transistor and said first sidewall spacer on said first transistor.

11. The device of claim 9, wherein a portion of said upper spacer of said first transistor is positioned on a sidewall of said gate electrode of said first transistor.

12. The device of claim 11, wherein at least a portion of said upper spacer on said first transistor contacts said first sidewall spacer on said first transistor.

13. The device of claim 9, wherein a base of said single continuous third spacer on said second transistor is positioned on said second active region between said metal silicide region on each of said source and drain regions of said second transistor and said first sidewall spacer on said second transistor.

14. The device of claim 9, wherein a top of said lower spacer is separated from a bottom of said upper spacer by a vertical distance.

15. The device of claim 14, wherein said vertical distance is at least approximately 5-20 nm.

16. The device of claim 9, wherein said lower spacer has an overall height that is approximately 20-50% of a height of said gate electrode of said first transistor and said upper spacer has an overall height that is approximately 5-30% of said height of said gate electrode of said first transistor.

17. The device of claim 9, wherein said first transistor is a PMOS transistor and said second transistor is an NMOS transistor.

18. An integrated circuit device, comprising:

first and second transistors positioned in and above respective first and second active regions of a semiconducting substrate, said first and second transistors comprising respective first and second gate electrodes, respective first and second source/drain regions, and respective first and second sidewall spacers positioned adjacent said respective first and second gate electrodes;

a metal silicide region on each of said first and second gate electrodes and on each of said first and second source/drain regions;

a multi-part second sidewall spacer comprising an upper spacer and a lower spacer positioned adjacent said first sidewall spacer, wherein a base of said lower spacer is positioned on said first active region between said metal silicide region on said first source/drain regions and said first sidewall spacer, and wherein a top of said lower spacer is vertically separated from a bottom of said upper spacer by a separation distance; and a single continuous third sidewall spacer positioned adjacent said second sidewall spacer, wherein a base of said single continuous third spacer is positioned on said second active region between said metal silicide region on said second source/drain regions and said second sidewall spacer.

19. The device of claim 18, wherein a first portion of said upper spacer is positioned on a sidewall of said first gate electrode and a second portion of said upper spacer contacts said first sidewall spacer.

20. The device of claim 1, wherein said upper spacer is vertically separated from said lower spacer and wherein said upper spacer is a same material as said lower spacer.

* * * * *